United States Patent
Dargis et al.

(10) Patent No.: US 8,636,844 B1
(45) Date of Patent: Jan. 28, 2014

(54) OXYGEN ENGINEERED SINGLE-CRYSTAL REO TEMPLATE

(75) Inventors: Rytis Dargis, Fremont, CA (US);
Andrew Clark, Los Altos, CA (US);
Michael Lebby, Apache Junction, AZ (US)

(73) Assignee: Translucent, Inc., Palo Alto, CA (US)

( * ) Notice: Subject to any disclaimer, the term of this patent is extended or adjusted under 35 U.S.C. 154(b) by 0 days.

(21) Appl. No.: 13/543,093

(22) Filed: Jul. 6, 2012

(51) Int. Cl.
*C30B 25/00* (2006.01)

(52) U.S. Cl.
USPC .......... 117/93; 117/84; 117/88; 117/89; 117/101; 117/102; 117/105

(58) Field of Classification Search
USPC ............... 117/84, 88, 89, 93, 101, 102, 105
See application file for complete search history.

(56) References Cited

U.S. PATENT DOCUMENTS

| | | | |
|---|---|---|---|
| 6,858,546 B2 * | 2/2005 | Niinist et al. | 438/785 |
| 2005/0266663 A1 * | 12/2005 | Bojarczuk et al. | 438/482 |
| 2008/0232761 A1 * | 9/2008 | Kumaran et al. | 385/142 |
| 2010/0065815 A1 * | 3/2010 | Bojarczuk et al. | 257/13 |
| 2010/0140755 A1 * | 6/2010 | Atanackovic | 257/632 |

* cited by examiner

Primary Examiner — Matthew Song
(74) Attorney, Agent, or Firm — Parsons & Goltry; Robert A. Parsons; Michael W. Goltry

(57) ABSTRACT

A method of forming a template on a silicon substrate includes epitaxially growing a template of single crystal ternary rare earth oxide on a silicon substrate and epitaxially growing a single crystal semiconductor active layer on the template. The active layer has either a cubic or a hexagonal crystal structure. During the epitaxial growth of the template, a partial pressure of oxygen is selected and a ratio of metals included in the ternary rare earth oxide is selected to match crystal spacing and structure of the template at a lower interface to the substrate and to match crystal spacing and structure of the template at an upper interface to crystal spacing and structure of the semiconductor active layer. A high oxygen partial pressure during growth of the template produces a stabilized cubic crystal structure and a low oxygen partial pressure produces a predominant peak with a hexagonal crystal structure.

6 Claims, 5 Drawing Sheets

OXYGEN ENGINEERED SINGLE-CRYSTAL REO TEMPLATE

FIELD OF THE INVENTION

This invention relates in general to the formation of semiconductor epitaxy on silicon wafers and more specifically to single-crystal rare earth oxide templates engineered for the growth of active semiconductor material.

BACKGROUND OF THE INVENTION

It has been found that III-V semiconductor materials (e.g. GaAs and GaN) and IV semiconductor materials (e.g. Si, Ge, C and combinations thereof) are a desirable semiconductor material in many electronic and photonic applications. As understood in the art, the active semiconductor material must be provided as a crystalline or single-crystal formation for the most efficient and useful bases for the fabrication of various electronic and photonic devices therein. Further, the single-crystal active semiconductor material is most conveniently formed on single-crystal silicon wafers because of the extensive background and technology developed in the silicon semiconductor industry. However, the crystal lattice constant mismatch between silicon and many active semiconductor materials, such as GaN, GaAs, SiGe, SiC is relatively large if grown c-axis on (111) oriented silicon. Also, the silicon substrate has a cubic crystal structure while the active semiconductor materials may have a cubic or hexagonal crystal structure. Growing cubic semiconductor layers on hexagonal oxides or vice versa results in high defect density in the semiconductor layers because of a different atom stacking sequence in the layers.

A buffer layer between the silicon substrate and the active semiconductor layer that compensates for the crystal lattice constant mismatch is preferably included. Several copending patent applications have been filed in the U.S. in which rare earth oxides were grown on a silicon substrate to serve as a stress engineered buffer layer for the subsequent growth of III-N semiconductor material. Two of these copending U.S. patent applications are: "Strain Compensated REO Buffer for III-N on Silicon", filed 21 Oct. 2011, bearing Ser. No. 13/278, 952; and "Nucleation of III-N on REO Templates", filed 20 Mar. 2012, bearing Ser. No. 61/613,289, both of which are included herein by reference. In a copending application entitled "Single Crystal Ge on Si", filed 20 Mar. 2012, with Ser. No. 13/425,079, and included herein by reference, a rare earth oxide with a normally hexagonal crystal structure is grown in a cubic form on a rare earth oxide with a cubic crystal structure by keeping the thickness below a crystal thickness. In U.S. Pat. No. 7,785,706, entitled "Semiconductor Wafer and Process for its Production", issued Aug. 31, 2010, semiconductors with hexagonal structure are grown on oxides with cubic Ia3 crystal structure.

One of the problems with prior art attempts to provide a crystal lattice match between a silicon substrate and an active semiconductor layer is that many layers of different material may be required to gradually shift the crystal lattice spacing from the silicon substrate to the active semiconductor material so that all of the various layers remain single crystal material. Also, different REO materials have different crystalline structures (i.e. cubic, hexagonal, monoclinic) so that matching different active semiconductor layers to silicon substrates requires different REO materials.

It would be highly advantageous, therefore, to remedy the foregoing and other deficiencies inherent in the prior art.

Accordingly, it is an object of the present invention to provide new and improved methods of engineering rare earth oxide (REO) templates for the growth of single-crystal active semiconductor material on silicon substrates.

It is another object of the present invention to provide new and improved methods of forming a REO template on a silicon substrate including as few as a single layer.

It is another object of the present invention to provide new and improved methods of forming a REO template on a silicon substrate that is easy and reliable to control.

It is another object of the present invention to provide a new and improved active semiconductor layer on a silicon substrate including an engineered REO template on the substrate.

SUMMARY OF THE INVENTION

Briefly, the desired objects and aspects of the instant invention are achieved in accordance with a preferred method of forming a template on a silicon substrate for the growth of a single crystal semiconductor active layer. The method includes the steps of epitaxially growing a template of single crystal ternary rare earth oxide on a silicon substrate using a partial pressure of oxygen and epitaxially growing a single crystal semiconductor active layer on the template. The active layer has either a cubic or a hexagonal crystal structure. During the epitaxial growth of the template, a partial pressure of oxygen is selected and a ratio of metals included in the ternary rare earth oxide is selected to match crystal spacing and structure of the template at a lower interface to the substrate and to match crystal spacing and structure of the template at an upper interface to crystal spacing and structure of the semiconductor active layer. In the selection of partial pressure during the process, a high oxygen partial pressure during growth of the template produces a stabilized cubic crystal structure and a low oxygen partial pressure produces a predominant peak with a hexagonal crystal structure.

The desired objects and aspects of the instant invention are further realized in accordance with a specific method of forming a template on a silicon substrate for the growth of a single crystal semiconductor active layer including the steps of providing a crystalline silicon substrate, epitaxially growing a layer of single crystal ternary rare earth oxide on the substrate using a high partial pressure of oxygen so that the ternary rare earth oxide layer has a stabilized cubic crystal structure, and epitaxially growing a single crystal semiconductor active layer on the ternary rare earth oxide layer, the active layer having a cubic crystal structure.

The desired objects and aspects of the instant invention are further realized in accordance with a specific method of forming a template on a silicon substrate for the growth of a single crystal semiconductor active layer including the steps of providing a crystalline silicon substrate, epitaxially growing a template including a first portion of single crystal ternary rare earth oxide adjacent the substrate using a high partial pressure of oxygen so that the first portion of ternary rare earth oxide layer has a stabilized cubic crystal structure and a second portion of single crystal ternary rare earth oxide on the first portion using a low partial pressure of oxygen so that the second portion of ternary rare earth oxide layer has a predominant peak with a hexagonal crystal structure, and epitaxially growing a single crystal semiconductor active layer on the template adjacent the second portion of ternary rare earth oxide, the active layer having a hexagonal crystal structure.

The desired objects and aspects of the instant invention are also realized in accordance with a specific template on a silicon substrate and a single crystal semiconductor active layer. The structure includes a crystalline silicon substrate with a template of single crystal ternary rare earth oxide grown on the substrate and forming an interface with the substrate matching crystal spacing and structure of the substrate. A single crystal semiconductor active layer is epitaxially grown on the ternary rare earth oxide layer. The active layer has either a cubic or a hexagonal crystal structure and forms an interface with the template matching crystal spacing and structure of the template.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

In view of the need for crystal matching in a process of forming active semiconductor layers on silicon substrates much effort and study has gone into the formation of a REO buffer template between the silicon substrate and the active semiconductor layer or layers. However, to date the various proposed methods generally require several different REO layers with different crystal lattice spacing and different crystal structure. Providing a variety of layers of different materials can increase the cost and complexity of the fabrication process. Also, some prior art devices suggest mixing crystal structures, such as placing layers with hexagonal crystal structures on layers with cubic crystal structures or vice versa. The present invention at least partially solves these problems by forming a template with a rare earth ternary oxide material containing different composition of materials and/or different oxygen partial pressure is used during the process. Thus, fewer layers can be used in a template and in many instances the layers can include the same materials grown under different conditions to accurately match the crystal spacing and structure of active semiconductor layers to silicon substrates.

Figure 1:
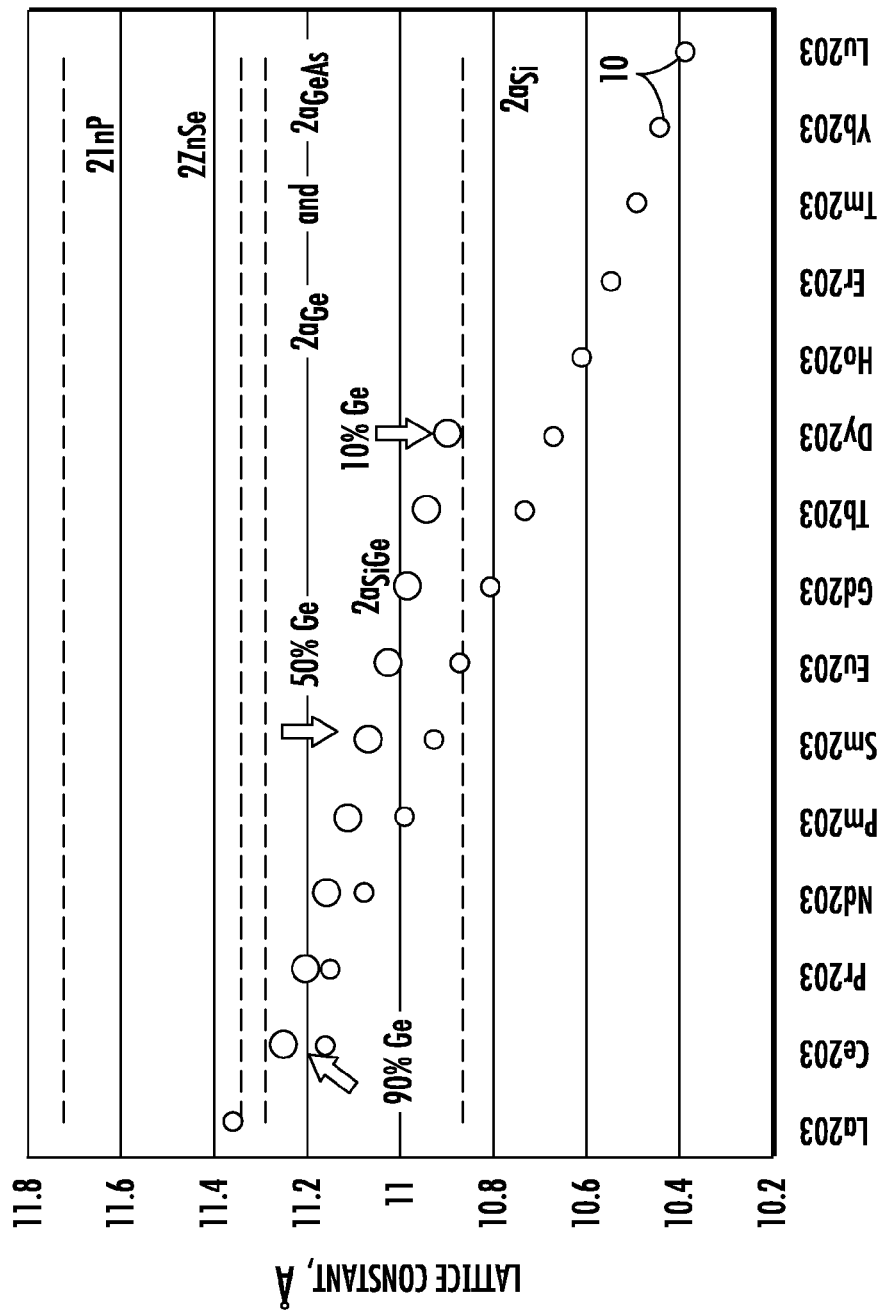
FIG. 1 generally illustrates the relationship between lattice constants of various group III-V and group IV semiconductor materials and various rare earth ternary oxides.

Turning to FIG. 1, the relationship between lattice constants of various group III-V and group IV semiconductor materials and various rare earth ternary oxides is illustrated. Broken lines extending horizontally across FIG. 1 illustrate the lattice constant of 2a or a double lattice spacing of InP, ZnSe, Ge and GaAs, and Si, respectively. A series of fifteen dots, designated 10, indicate the approximate lattice constant of the fifteen rare earth ternary oxides listed along the bottom of FIG. 1. A series of nine dots illustrate the approximate lattice constant of the double lattice spacing of SiGe with the amount of germanium in the mix varying between 90% at the far left and 10% at the far right. From this drawing it will be understood that the lattice spacing of a III-V semiconductor material can be varied by varying the composition of the material.

Figure 2:
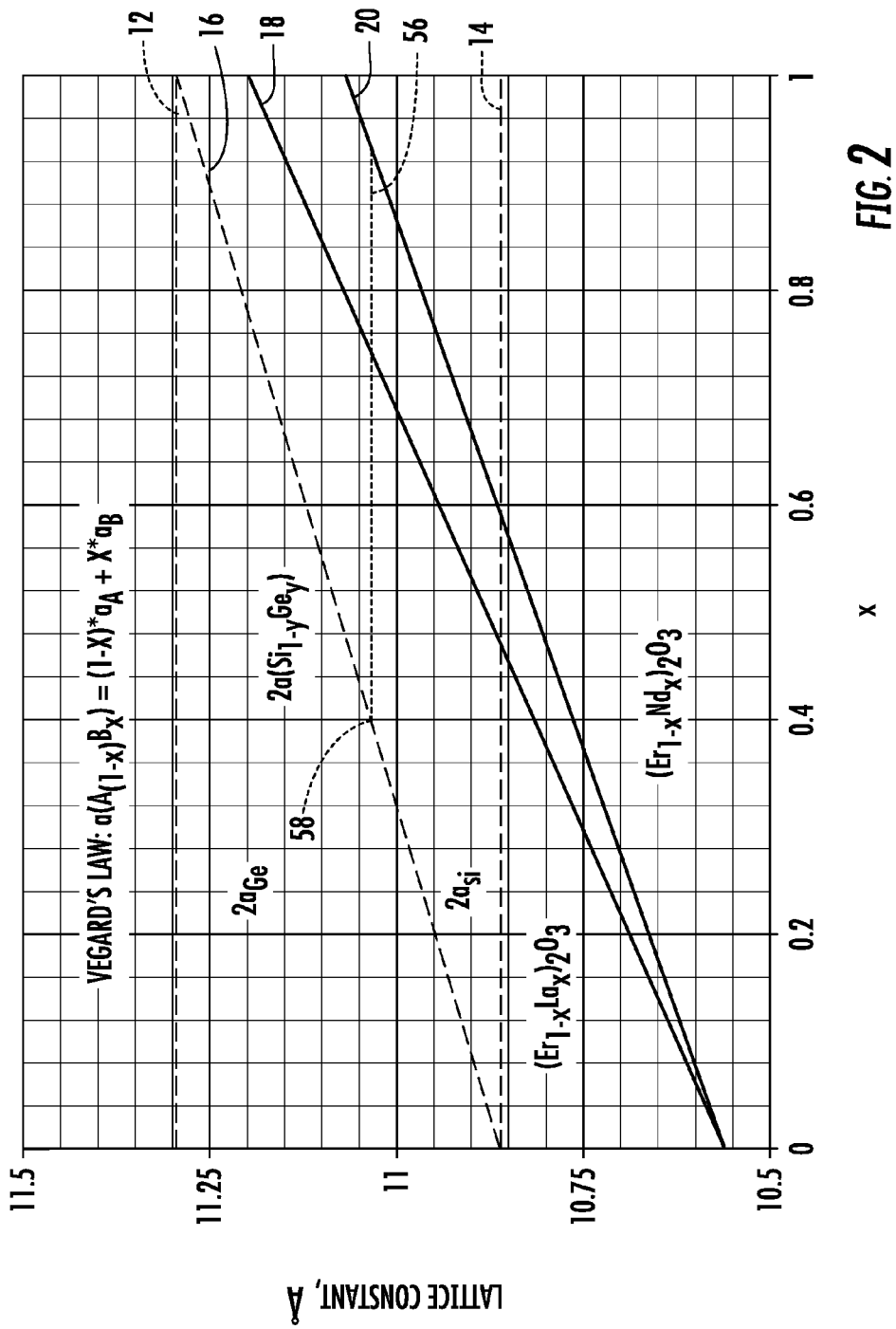
FIG. 2 illustrates a specific example of materials intermixed in accordance with Vegard's law to provide lattice constant tuning in accordance with the present invention.

Referring additionally to FIG. 2, Vegard's law is illustrated along with a specific example of materials intermixed in accordance with Vegard's law to provide lattice constant tuning in accordance with the present invention. As illustrated, Vegard's law is $a(A_{(1-x)}B_x) = (1-x)*a_A + x*a_B$, where a indicates the lattice spacing of the material and A and B are different materials. It should be understood that lattice constant change by intermixing of two materials with different lattice constants generally obeys Vegard's law. In FIG. 2 a horizontal broken line, designated 12, illustrates the lattice constant of $2a_{Ge}$ (double lattice spacing of germanium) and a horizontal broken line, designated 14, illustrates the lattice constant of $2a_{Si}$ (double lattice spacing of silicon). A sloped broken line, designated 16, illustrates the lattice constant of $2a(Si_{1-y}Ge_y)$, which generally obeys Vegard's law, that is the slope changes as the composition varies from pure silicon at the far left to pure germanium at the far right. Also illustrated are a sloped line designated 18 that represents the lattice constant of $(Er_{1-x}La_x)_2O_3$ as x varies from zero to 1 and a sloped line designated 20 that represents the lattice constant of $(Er_{1-x}Nd_x)_2O_3$ as x varies from zero to 1. From this drawing it can be seen that the lattice constant of the group IV semiconductor material $2a(Si_{1-y}Ge_y)$ is equal to the lattice constant of the ternary oxide $(Er_{1-x}Nd_x)_2O_3$ when y=0.4 and x=0.9 and the lattice constant of the group IV semiconductor material $2a(Si_{1-y}Ge_y)$ is equal to the lattice constant of the ternary oxide $(Er_{1-x}La_x)_2O_3$ when y=0.4 and x is approximately equal to 0.72. It will be understood that specific ternary oxides and a specific semiconductor material are used herein for purposes of explanation and the concept is not limited to the specific materials shown. Also, the term "matched" is used herein when the lattice spacing of ternary oxide is substantially equal to the lattice spacing or multiples of the lattice spacing of the active semiconductor material.

Figure 3:
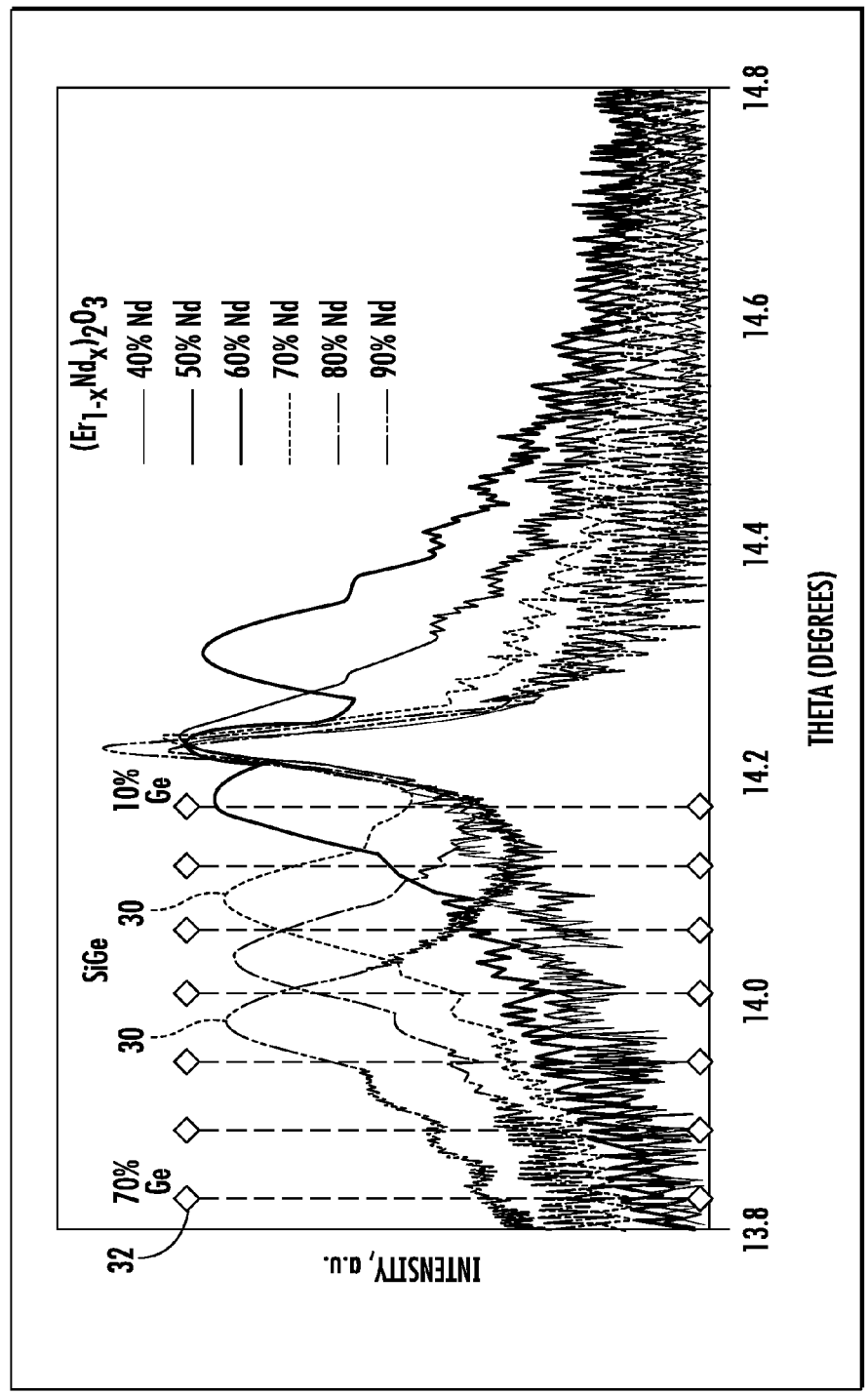
FIG. 3 is a graph illustrating the result of different compositions of a specific example of a rare earth oxide and the relationship to different compositions of a specific example of a group IV semiconductor material, in accordance with the present invention.

Turning now to FIG. 3, a series of peaked graphs gradually migrating from left to right, designated 30, illustrate the results from varying the neodymium in the ternary oxide $(Er_{1-x}Nd_x)_2O_3$ from 90% at the far left to 40% at the far right. Also, a series of vertical broken lines, designated 32, illustrate the results from varying the germanium in the compound SiGe between 70% at the far left to 10% at the far right. The graph was produced from X-ray diffraction scans of material samples with ternary cubic single crystal REO layers containing the illustrated different compositions. The possible crystal matching with SiGe layers having different compositions is illustrated.

Figure 4:
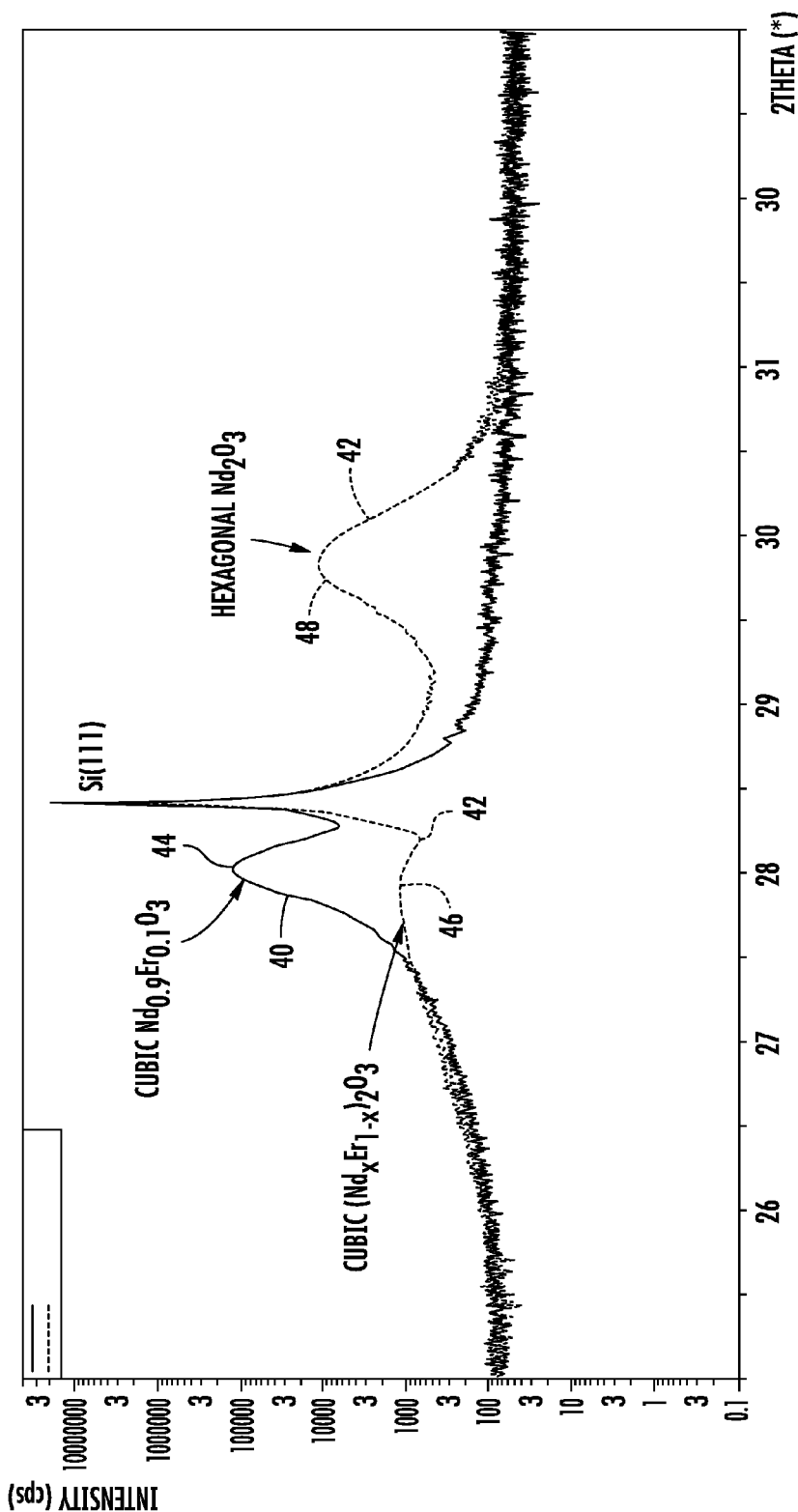
FIG. 4 is a graph illustrating the effects of changing the partial pressure of oxygen during growth of a rare earth ternary oxide, in accordance with the present invention.

Shown in FIG. 4 is a graph illustrating the effects of changing the partial pressure of oxygen during growth of a rare earth ternary oxide, in accordance with the present invention. In this process two samples of the ternary oxide $(Nd_xEr_{1-x})_2O_3$ were grown in 100 nm thick layers with different oxygen partial pressures in the chamber. Specifically, in each of the two samples the rare earth ternary oxide used was $Nd_{0.9}Er_{0.1}O_3$. A curve designated 40 shows that in a first of the two samples in which the rare earth ternary oxide was grown in an oxygen rich environment (high oxygen partial pressure) only a cubic phase exists as indicated by peak 44. A curve designated 42 shows that in a second of the two samples in which the rare earth ternary oxide was grown in a low oxygen environment (low oxygen partial pressure) both cubic and hexagonal phases exist as indicated by peaks 46 and 48, respectively. However, in the second sample hexagonal peak 48 is predominant or much stronger. In this process the low oxygen partial pressure was approximately $3.1 \times 10^6$ Torr and the high oxygen partial pressure was $5.8 \times 10^6$ Torr. It will be understood that the pressure varies slightly during the process so that a $+/- 5 \times 10^7$ should be included. It should be understood that the low and high partial pressures may vary somewhat depending upon the specific configuration of the epitaxy equipment and the metal oxide and oxygen (e.g. molecular oxygen, oxygen plasma, etc,) being evaporated. It will be noted that the peak position 48 is the same position as a hexagonal peak for pure $Nd_2O_3$ so that it appears there is a separation of phases, that is a part of the Nd forms $Nd_2O_3$ (or $(ErNd)_2O_3$) which is hexagonal (peak 48) and a smaller part composes cubic $(ErNd)_2O_3$ (peak 46). It will be understood that while specific materials are used in this example, the process applies to any rare earth ternary oxide.

For purposes of this disclosure the term "high partial pressure of oxygen" or "high oxygen partial pressure" is defined to mean a pressure sufficient to grow a ternary rare earth oxide layer with a stabilized cubic crystal structure. Also, the term "low partial pressure of oxygen" or "low oxygen partial pressure" is defined to mean a pressure sufficient to grow a ternary rare earth oxide layer with a predominant peak of hexagonal crystal structure.

Figure 5:
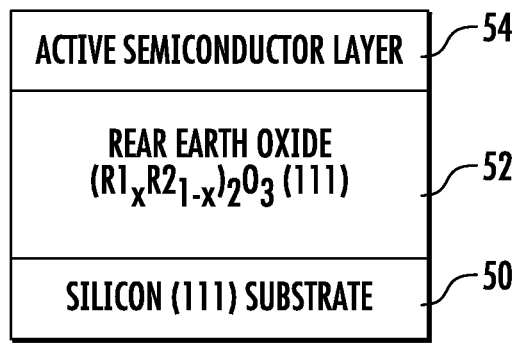
FIG. 5 is a simplified layer diagram of a rare earth ternary oxide template lattice matching an active semiconductor layer to a silicon substrate, in accordance with the present invention.

Turning now to FIG. 5, a simplified layer diagram is illustrated of a rare earth ternary oxide template lattice, in accordance with the present invention. A silicon substrate 50 is included which is a standard well know single crystal wafer or portion thereof generally known and used in the semiconductor industry. Single crystal silicon substrate 50, it will be understood, is not limited to any specific crystal orientation but could include <111> silicon, <110> silicon, <100> silicon or any other orientation or variation known and used in the art.

A layer 52 of single crystal ternary rare earth oxide is epitaxially grown on substrate 50 to serve as a template for the epitaxial growth of an active semiconductor layer 54. The ternary rare earth oxide in layer 52 is $(R1_xR2_{1-x})_2O_3$, where R1 and R2 are different rare earth metals. Throughout this disclosure whenever rare earth metals are mentioned it will be understood that "rare earth" metals are generally defined as any of the lanthanides as well as scandium and yttrium. Active semiconductor layer 54 includes any of the well-known group III-V or group IV semiconductor materials, such as Si, Ge, Ga, SiGe, SiC, GaAs, GaN, or any combinations thereof with a cubic crystal structure. Here it should be noted that the group IV semiconductor material SiGe has a cubic crystal structure, while the group IV semiconductor material SiC can have either a cubic crystal structure or a hexagonal crystal structure. The group III-V semiconductor material GaAs has a cubic crystal structure.

In addition to the difference in crystal lattice spacing, it will be understood that the active semiconductor layer could have a cubic or hexagonal crystal structure. Thus, the template must be engineered to match the crystal lattice spacing and the crystal structure of silicon substrate 50 to active semiconductor layer 54. In the specific example illustrated in FIG. 5 active semiconductor layer 54 has a cubic lattice structure. Thus, template layer 52 is engineered to match the lattice spacing and the cubic lattice structure of silicon substrate 50 to the cubic lattice structure and spacing of active semiconductor layer 54.

As described above and illustrated in FIGS. 2 and 3 above, the crystal lattice spacing between template layer 52 and active semiconductor layer 54 can be accurately matched by varying the R1 and R2 components of template layer 52 and/or the III-V components of active semiconductor layer 54. As a specific example of this matching and referring again to FIG. 2, it can be seen that the rare earth ternary $(Er_{1-x}Nd_x)_2O_3$, has a lattice constant substantially equal to silicon (2aSi) when x is equal to 0.6. Also, the rare earth ternary $(Er_{1-x}Nd_x)_2O_3$, has a lattice constant (designated 56 in FIG. 2) substantially equal to the lattice constant (designated 58) of $2a(Si_{1-y}Ge_y)$, when x is equal to 0.9 and y is equal to 0.4. Further, by adjusting the oxygen partial pressure to a high partial pressure (as illustrated and explained in conjunction with FIG. 4) during growth of template layer 52 a cubic lattice structure, which is not common for large cation ionic radius earth oxides, can be stabilized. Thus, by selecting the partial pressure of oxygen and the specific ratio of rare earth metals in template layer 52 the template can be constructed to accurately match the crystal spacing and structure of substrate 50 to active semiconductor layer 54.

Figure 6:
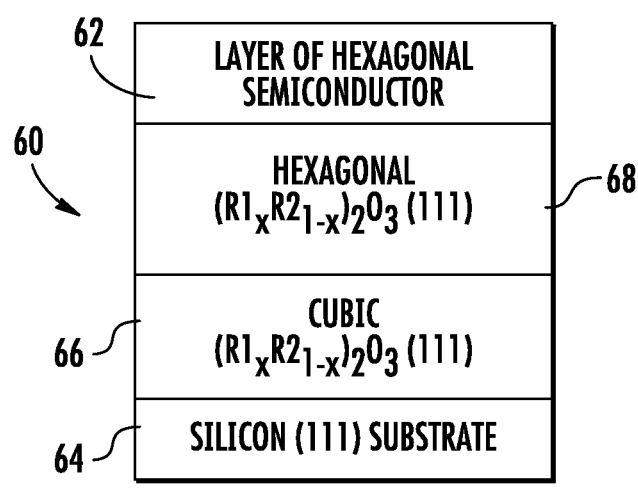
FIG. 6 is a simplified layer diagram of another example of a rare earth ternary oxide template lattice matching an active semiconductor layer to a silicon substrate, in accordance with the present invention.

Turning now to FIG. 6 an example is illustrated of a specifically engineered single crystal ternary rare earth oxide template, generally designated 60, for matching an active semiconductor layer 62 to a silicon substrate 64. In this specific example active semiconductor layer 62 has a hexagonal crystal structure. For example, the group III-V semiconductor material GaN has a hexagonal crystal structure and the group IV semiconductor material SiC may have a hexagonal crystal structure. Therefore, template 60 includes a first ternary rare earth oxide portion or layer 66 with a cubic crystal structure to match the cubic crystal structure of silicon substrate 64. Layer 66 can be fabricated in a process similar to the fabrication of layer 52 in FIG. 5. Template 60 also includes a second ternary rare earth oxide portion or layer 68 with a hexagonal crystal structure to match the hexagonal crystal structure of active semiconductor layer 62. Layer 68 can include, for example, the same ternary rare earth oxide as layer 66 but will be grown or formed with a hexagonal lattice structure to match active semiconductor layer 62. This is accomplished by providing a low oxygen partial pressure as explained above. Thus, template 60 can be grown without changing the materials and only changing the oxygen partial pressure. It will be understood, however, that during the growth process the ratios or even types of rare earth materials in layers 66 and 68 can be changed in addition to or instead of changing the oxygen partial pressure but the partial pressure change is preferred because of its simplicity.

Thus, a single crystal ternary rare earth oxide template is engineered to lattice match an active semiconductor layer to a silicon substrate both in lattice spacing and in lattice structure. The engineering of the template includes using an oxygen partial pressure during growth to produce a specific hexagonal or cubic crystal structure in the template and varying the proportion of rare earth materials in the ternary rare earth oxide to match the lattice spacing to both the silicon substrate and the active semiconductor layer. Therefore, the present invention provides new and improved methods of engineering rare earth oxide (REO) templates for the growth of single-crystal active semiconductor material on silicon substrates. Through the use of the new and improved methods templates can be grown in single layers using the same material throughout the single layer.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A method of forming a template on a silicon substrate for the growth of a single crystal semiconductor active layer comprising the steps of:
providing a crystalline silicon substrate;
epitaxially growing a template including a first portion of single crystal ternary rare earth oxide adjacent the substrate using a high partial pressure of oxygen so that the first portion of ternary rare earth oxide layer has a stabilized cubic crystal structure and a second portion of single crystal ternary rare earth oxide on the first portion using a low partial pressure of oxygen so that the second portion of ternary rare earth oxide layer has a predominant peak with a hexagonal crystal structure; and
epitaxially growing a single crystal semiconductor active layer on the template adjacent the second portion of ternary rare earth oxide, the active layer having a hexagonal crystal structure.

2. A method as claimed in claim 1 wherein the step of epitaxially growing the first portion and epitaxially growing the second portion of the template is performed in a continuous growth process and the rare earth oxide includes the same rare earth metals throughout the process.

3. A method as claimed in claim 1 wherein the low oxygen partial pressure used is approximately $3.1 \times 10^{-6}$ Torr$+/-5 \times 10^{-7}$.

4. A method as claimed in claim 1 wherein the step of epitaxially growing the first portion of the template includes using a ternary rare earth oxide represented by $(R1_x R2_{1-x})_2O_3$, where R1 and R2 are different rare earth metals, and x is selected to be in a range of $\geq 0$ to $\leq 1$.

5. A method as claimed in claim 4 wherein the step of epitaxially growing the second portion includes using a ternary rare earth oxide represented by $(R1_x R2_{1-x})_2O_3$, where R1 and R2 are different rare earth metals, and x is selected to be in a range of $\geq 0$ to $\leq 1$.

6. A method as claimed in claim 5 including in addition the steps of selecting x in the first portion to provide a crystal lattice spacing of the first portion substantially matching the crystal lattice spacing of the substrate and selecting x in the second portion to provide a crystal lattice spacing of the second portion substantially matching the crystal lattice spacing of the single crystal semiconductor active layer.

* * * * *